United States Patent [19]
Choi

[11] Patent Number: 5,477,060
[45] Date of Patent: * Dec. 19, 1995

[54] INFRARED HOT ELECTRON TRANSISTOR WITH A SUPERLATTICE BASE

[75] Inventor: Kwong-Kit Choi, Tinton Falls, N.J.

[73] Assignee: The United States of America as represented by the Secretary of the Army, Washington, D.C.

[*] Notice: The portion of the term of this patent subsequent to Jul. 9, 2008, has been disclaimed.

[21] Appl. No.: 82,655

[22] Filed: Jun. 25, 1993

[51] Int. Cl.⁶ .................. H01L 29/06; H01L 31/0328; H01L 31/0336
[52] U.S. Cl. .................. 257/15; 257/14; 257/17; 257/21
[58] Field of Search .................. 257/15, 14, 17, 257/18, 21

[56] References Cited

U.S. PATENT DOCUMENTS

| | | | |
|---|---|---|---|
| 5,013,918 | 5/1991 | Choi | 250/338.4 |
| 5,031,013 | 7/1991 | Choi | 257/14 |
| 5,300,794 | 4/1994 | Melman et al. | 257/15 |

FOREIGN PATENT DOCUMENTS

| | | |
|---|---|---|
| 60-010775 | 1/1985 | Japan . |
| 62-166564 | 7/1987 | Japan . |
| 3-014240 | 1/1991 | Japan . |
| 92008250 | 5/1992 | WIPO . |

OTHER PUBLICATIONS

K. Choi, "10 Micrometer infrared hot–electron transistors", Applied Physics Letters, vol. 57 (1990), pp. 1348–1350.

Primary Examiner—Robert P. Limanek
Assistant Examiner—T. M. Arroyo
Attorney, Agent, or Firm—Michael Zelenka; William H. Anderson

[57] ABSTRACT

A semiconductor infrared detector having a transistor structure with a superlattice base. The superlattice base is between a multiple quantum well (MQW) structure and an electron energy high pass filter. The superlattice base restricts electrons to minibands resulting in no overlap in energy between the energies of the photoelectrons and the dark electrons. As a result, more photoelectrons reach the collector, and the emitter to collector photocurrent transfer ratio is increased. The increased transfer ratio results in increased sensitivity of the detector. The superlattice base between the MQW structure and the electron energy high pass filter comprises multiple alternating wells and barriers. The wells are preferably made of GaAs and the barriers are preferably made of $Al_xGa_{1-x}As$, where x is equal to 0.25. However, alternate embodiments may include all the combinations of the Al molar ratio x in the barriers in the light sensitive MQW region, the superlattice base, and the electron energy high pass filter. The minibands created in the superlattice base confines the photoelectrons into a miniband by reducing the phonon emission rate, and removing the available states between the minibands.

12 Claims, 2 Drawing Sheets

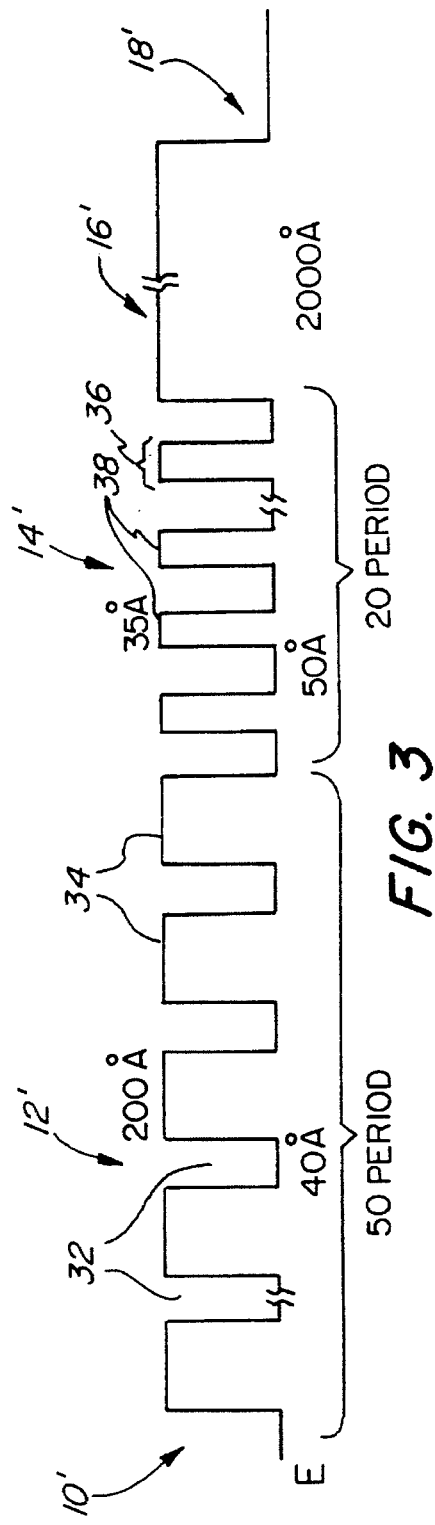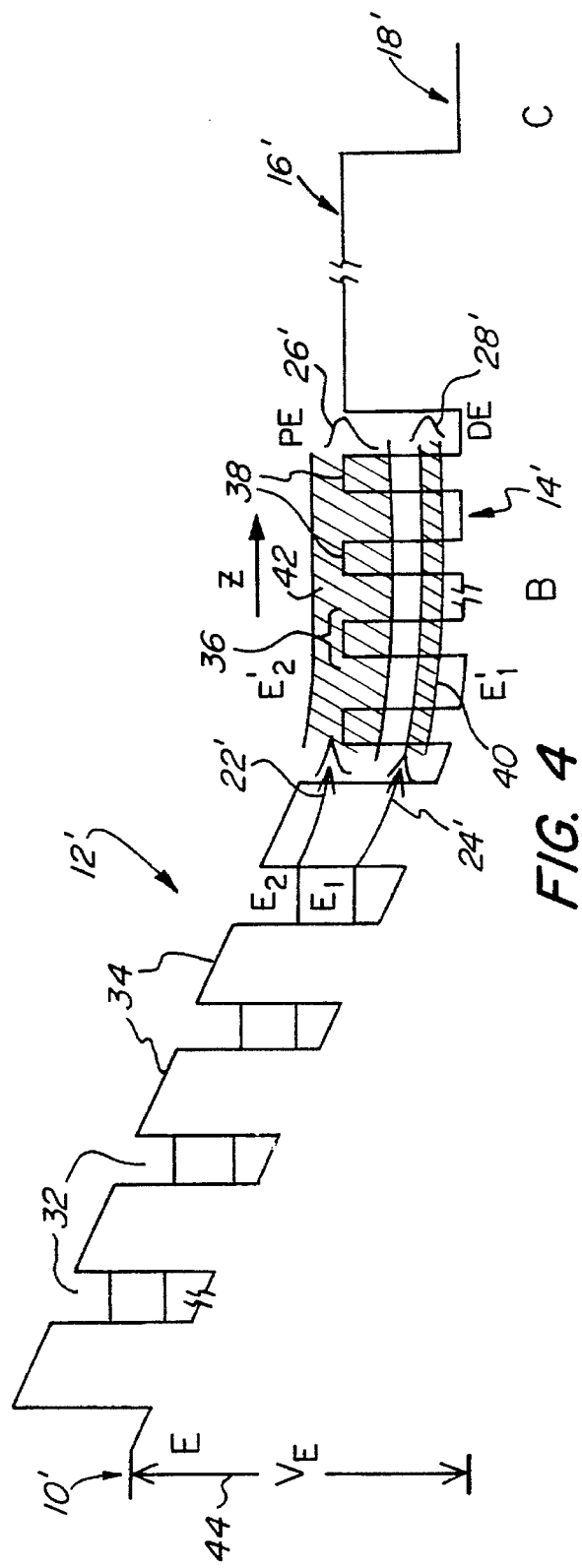

5,477,060

INFRARED HOT ELECTRON TRANSISTOR WITH A SUPERLATTICE BASE

GOVERNMENT INTEREST

The invention described herein may be manufactured, used, and licensed by or for the Government for governmental purposes without the payment to me of any royalties thereon.

FIELD OF THE INVENTION

This invention relates in general to infrared detection devices, and specifically to a transistor structure having improved infrared sensitivity.

BACKGROUND OF THE INVENTION

Infrared devices are used in many practical applications such as communications, security systems, and other modern electronic devices. In many of these applications, the sensitivity of the infrared detector is critical to its application. There have been many advances in the use of semiconductors and transistor structures for detecting infrared radiation or light. Many of these advances have resulted in faster, more responsive detectors, as well as detectors capable of detecting multi-color infrared radiation. One such detector is disclosed in U.S. Pat. No. 5,013,918 issuing to Choi on May 7, 1991, and entitled "Multi Color Infrared Photodetector", which is herein incorporated by reference.

In another publication entitled "10 Micrometer Infrared Hot Electron Transistors" by K. Choi, et al, Applied Physics Letters, Vol. 57 (Sep. 1990), Pages 1348–1350, an infrared detector is disclosed having an energy filter that selectively permits the high energy photocurrent to pass to the collector while rejecting the low energy dark current. The device sensitivity or detectivity is thereby enhanced.

While there are infrared photoconductor devices with adequate sensitivity for various applications, there is a continuing need to improve the detectivity or sensitivity of infrared detection devices.

SUMMARY OF THE INVENTION

The present invention comprises a semiconductor structure forming an infrared hot electron transistor with a base formed of a superlattice having multiple wells and barriers which reduce energy relaxation and create discreet energy states reducing the final state the electron can be scattered into. This reduces the phonon scattering in the base and prevents the overlap in energy of the photoelectrons and the dark electrons. Thereby, the dark electrons are more effectively removed by an electron energy high pass filter.

Accordingly, it is an object of the present invention to improve sensitivity of an infrared hot electron transistor.

It is an advantage of the present invention that the transfer ratio of electrons from emitter to base is increased.

It is a feature of the present invention that the base is made of a superlattice of alternating quantum wells and barriers.

These and other objects, advantages, and features will become readily apparent in view of the following more detailed description.

BRIEF DESCRIPTION OF THE DRAWINGS

FIG. 3 is an energy band diagram illustrating the present invention.

FIG. 4 is an energy band diagram illustrating energy levels in a stature of the present invention with a forward emitter bias.

DETAILED DESCRIPTION OF THE PREFERRED EMBODIMENT

Figure 1:
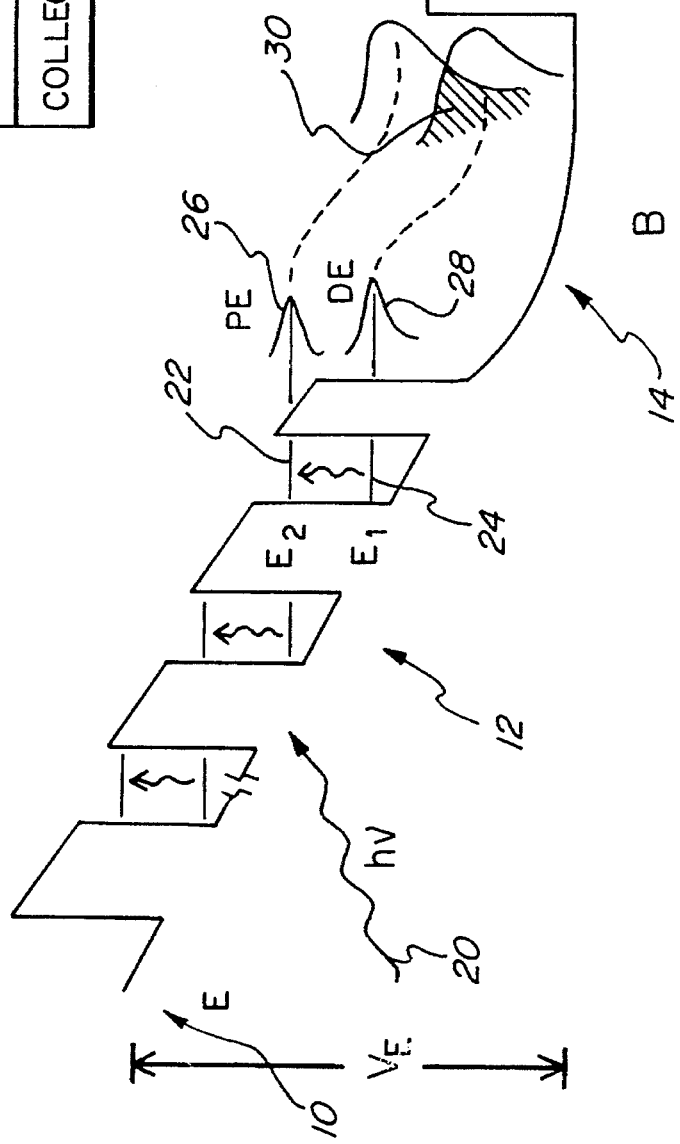
FIG. 1 is an energy band diagram illustrating a prior art infrared hot electron transistor.

The energy band structure of a prior art device is illustrated in FIG. 1. An emitter contact 10 is placed adjacent a multiple quantum well (MQW) structure 12. The MQW structure is comprised of a plurality of periodic wells and barriers. At the other end of the MQW structure is base 14. On the other side of base 14 is electron energy high pass filter 16. On the other side of the electron energy high pass filter 16 is collector 18. Two energy levels are formed in the MQW structure 12, energy level 22 designated as $E_2$ and energy level 24 designated as $E_1$. When a photon represented by wavy arrow 20 strikes the detector, an electron is caused to jump to the $E_2$ energy level 22. The distribution of these photoelectrons is represented at 26 and indicated as PE. When the device is not exposed to infrared radiation, a group of electrons at energy level 24 and designated $E_1$ is injected into the base. The electron distribution is illustrated at 28 and is designed as dark electrons DE. The photoelectrons represented at 26 are the electrons resulting from the infrared radiation or photons received by the detector and are therefore the electrons desired to be detected. The electron energy high pass filter 16 successfully eliminates the dark electrons at the lower $E_1$ energy level 24. However, the energy level of the photoelectrons 26 and the dark electrons 28 overlap as illustrated at 30. Therefore, some of the photoelectrons 26 are filtered by the electron energy high pass filter 16 and do not reach the collector 18. This effectively reduces the sensitivity of the device.

Figure 2:
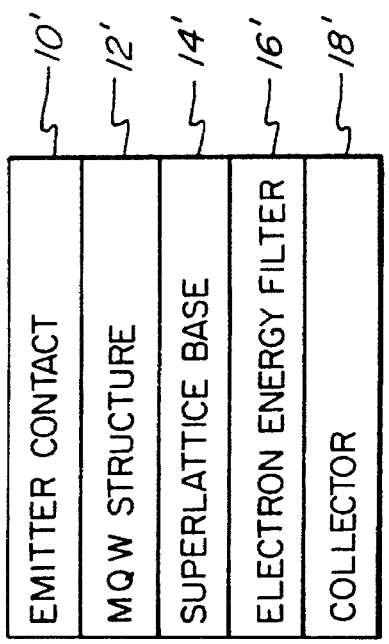
FIG. 2 is a generalized representation of the structure of the present invention.

FIG. 2 illustrates in a general way the layered structure of the present invention. Emitter contact 10' is placed adjacent MQW structure 12', which is placed adjacent superlattice base 14', which is placed adjacent electron energy filter 16', which is placed adjacent collector 18'. FIG. 2 merely illustrates relative position and is not intended to represent the actual thickness of any of the successive layers. Additionally, the layers are not isolated and the topography of each layer may effect or form a part of another layer. Additionally, each layer may be composed of several sublayers that perform the function identified in the layer.

FIG. 3 illustrates the structure of the present invention. Emitter contact 10' is at one end of the MQW structure 12'. The MQW structure 12' comprises 50 periods of 200 Å of aluminum gallium arsenide (AlGaAs) undoped barriers 34 and gallium arsenide (GaAs) wells doped such that $n^+=1\times 10^{18}$ cm$^{-3}$ and having a width or thickness of 40 Å. Adjacent the MQW structure is the superlattice base comprised of 20 periods of barriers and wells. The base barriers are made of $Al_xGa_{1-x}AS$ and the wells are made of GaAs, were x includes all the combinations of Al molar ratio, and is preferably 0.25. The base barriers have a width of 35 Å and the wells have a width or thickness of 50 Å and are doped such that $n^+=0.4\times 10^{18}$ cm$^{-3}$. Adjacent superlattice base 14' is electron energy high pass filter 16'. The filter 16' has a width or thickness of 2000 Å. Adjacent the other end of filter 16' is collector 18'. Collector 18' is made of GaAs doped such that $n^+=0.1\times 10^{18}$ cm$^{-3}$.

FIG. 4 illustrates the present invention operating at a forward voltage bias $V_E$ indicated at 44 between the emitter 10' and the superlattice base 14'. Within the MQW structure 12' are two energy subbands $E_1$ at indicated at 24' and $E_2$ indicated at 22'. Within the superlattice base 14' of the present invention is formed two minibands $E'_1$ indicated at 40 and $E'_2$ indicated at 42. The location of the minibands 40 and 42 match that of the subbands 24' and 22'. The miniband 42 corresponds to the photoelectrons and the miniband 40 corresponds to the dark electrons. The photoelectron distribution is illustrated at 26' and the dark electron distribution is illustrated at 28'. The separation between the minibands 40 and 42 should be larger than several optical phonon energies. As illustrated by the energy distributions of the photoelectrons 26' and dark electrons 28', there is no overlap of energies. As a result, the electron energy high pass filter 16' filters the dark electrons preventing them from reaching the collector 18', thereby increasing the photoelectrons reaching the collector and therefore the photocurrent transfer ratio from the emitter to the collector. As a result, sensitivity of the detector is increased.

The superlattice base 14' of the present invention helps to reduce the electron energy relaxation due to optical phonon emissions. This electron energy relaxation causes the photoelectron's energy to overlap with that of the dark electrons. The superlattice base 14' of the present invention creates discreet energy states in the Z or parallel direction, reducing the final state the electron can be scattered into. Therefore, phonon scattering in the base is reduced which prevents the overlap in energy of the photoelectrons and the dark electrons. The superlattice base 14' confines the respective hot electrons within the minibands and thereby reduces relaxation.

From the above, it should readily be appreciated that the infrared hot electron transistor structure of the present invention, including a superlattice base which confines the electrons into minibands, greatly increases the sensitivity of the device. The increase in sensitivity of the present invention improves present applications of infrared detectors and makes other applications more practical.

Although the preferred embodiment has been illustrated and described, it will be obvious to those skilled in the art that various modifications, such as the well width and the barrier height of both the light sensitive MQW structure and the superlattice base, may be made without departing from the spirit and scope of this invention.

What is claimed is:

1. A semiconductor infrared radiation detector comprising:
   an emitter contact;
   a light sensitive multiple quantum well (MQW) structure having a first, plurality of wells and barriers;
   a superlattice base having a second plurality of wells and barriers adjacent said light sensitive MQW structure, the second plurality of wells and barriers having a different physical structure from that of the first plurality of wells and barriers;
   an electron energy filter adjacent said superlattice base the electron energy filter having a structure that filters dark electrons; and
   a collector adjacent said electron energy filter.

2. A semiconductor infrared radiation detector as in claim 1 wherein:
   said MQW structure has at least two quantum energy subbands.

3. A semiconductor infrared radiation detector as in claim wherein:
   said superlattice base has at least two quantum energy minibands.

4. A semiconductor infrared radiation detector as in claim 3 wherein:
   the at least two quantum energy subbands and the at least two quantum energy minibands have substantially the same energy level.

5. A semiconductor infrared radiation detector as in claim 3 wherein:
   the minibands are separated by more than one optical phonon energy.

6. A semiconductor infrared radiation detector as in claim 1 wherein:
   the plurality of wells and barriers of the superlattice base have a period of 20.

7. A semiconductor infrared radiation detector as in claim 1 wherein:
   the wells are made of GaAs.

8. A semiconductor infrared radiation detector as in claim 1 wherein:
   the barriers are made of $Al_{0.25}Ga_{0.75}As$.

9. A semiconductor infrared radiation detector as in claim 1 wherein:
   the wells have a width of substantially 35 Å.

10. A semiconductor infrared radiation detector as in claim 9 wherein:
    the barriers have a width of substantially 50 Å.

11. A semiconductor infrared radiation detector as in claim 1 wherein:
    said electron energy filter is a barriers having a width of substantially 2000 Å.

12. A semiconductor infrared radiation detector comprising:
    an emitter contact;
    a light sensitive MQW structure having a first plurality of wells and barriers having a period of 50, the first plurality of wells having a width of 40 Å and the first plurality of barriers having a width of 200 Å;
    a superlattice base, adjacent said light sensitive MQW, having a second plurality of wells and barriers having a period of 20, the second plurality of wells having a width of 50 Å and the second plurality of barriers having a width of 35 Å;
    an electron energy high pass filter, adjacent said superlattice base, having a single barrier with a width of 2000 Å; and
    a collector adjacent said electron energy high pass filter,
    said first and second plurality of wells being formed of GaAs, said first and second plurality of barriers and said single barriers being formed of $Al_{0.25}Ga_{0.75}As$,
    whereby the transfer ratio between said emitter contact and said base is increased resulting in improved infrared sensitivity.

\* \* \* \* \*